United States Patent
Lee

(10) Patent No.: US 8,227,176 B2
(45) Date of Patent: Jul. 24, 2012

(54) METHOD FOR FORMING FINE PATTERN IN SEMICONDUCTOR DEVICE

(75) Inventor: Sung-Kwon Lee, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 601 days.

(21) Appl. No.: 12/165,401

(22) Filed: Jun. 30, 2008

(65) Prior Publication Data

US 2009/0117492 A1    May 7, 2009

(30) Foreign Application Priority Data

Nov. 2, 2007    (KR) .................. 10-2007-0111676
May 27, 2008    (KR) .................. 10-2008-0049145

(51) Int. Cl.
    *G03F 7/26*    (2006.01)
(52) U.S. Cl. .............................................. 430/315
(58) Field of Classification Search .................. 430/311, 430/314, 313
    See application file for complete search history.

(56) References Cited

U.S. PATENT DOCUMENTS

| | | | | |
|---|---|---|---|---|
| 5,858,847 | A * | 1/1999 | Zhou et al. | 438/305 |
| 6,416,933 | B1 * | 7/2002 | Singh et al. | 430/313 |
| 6,916,746 | B1 | 7/2005 | Hudson et al. | |
| 7,235,478 | B2 | 6/2007 | Geng et al. | |
| 7,241,683 | B2 | 7/2007 | Hudson et al. | |
| 2008/0064213 | A1 * | 3/2008 | Jung | 438/696 |

FOREIGN PATENT DOCUMENTS

| | | |
|---|---|---|
| KR | 1020060104397 A | 10/2006 |
| KR | 1020070069914 A | 7/2007 |
| KR | 1020070076793 A | 7/2007 |
| KR | 1020070107345 A | 11/2007 |

* cited by examiner

*Primary Examiner* — Kathleen Duda
*Assistant Examiner* — Caleen Sullivan
(74) *Attorney, Agent, or Firm* — Kilpatrick Townsend & Stockton LLP

(57) ABSTRACT

A method is used in forming a fine pattern in a semiconductor device. The method includes forming an etch target layer; forming a photoresist pattern over the etch target layer; forming a polymer pattern including silicon-oxygen (Si—O) bonds on sidewalls of the photoresist pattern; removing the photoresist pattern; and etching the etch target layer using the polymer pattern as an etch mask.

16 Claims, 5 Drawing Sheets

METHOD FOR FORMING FINE PATTERN IN SEMICONDUCTOR DEVICE

CROSS-REFERENCE TO RELATED APPLICATIONS

The present invention claims priority of Korean patent application numbers 10-2007-0111676 and 10-2008-0049145, filed on Nov. 2, 2007, and May 27, 2008, respectively, which are incorporated by reference in their entirety.

BACKGROUND OF THE INVENTION

The present invention relates to a method for fabricating a semiconductor device, and more particularly, to a method for forming a fine pattern in a semiconductor device.

As semiconductor devices become highly integrated, a line width of a pattern needs to be decreased. However, because of resolution limitations of currently developed photo-exposure apparatus, it is difficult to fabricate a semiconductor device with a fine pattern having a line width of under 40 nm.

In order to decrease a line width of a pattern, double exposure and etch technology (DEET), which forms a fine pattern by performing a photolithography process twice, has been suggested. However, DEET causes an overlay problem.

In order to solve the above described limitations, spacer patterning technology (SPT) has been suggested.

FIGS. 1A to 1D are cross-sectional views illustrating a typical method for performing SPT.

In FIG. 1A, a hard mask 11 is formed over a etch target layer 10, and then, a photoresist pattern 12 is formed over the hard mask 11.

Referring to FIG. 1B, a material layer 13 for a spacer is formed over the whole surface of the resultant structure including the photoresist pattern 12.

Referring to FIG. 1C, a spacer 13A is formed on both sidewalls of the photoresist pattern 12 by performing a blanket etch process on the material layer 13.

Referring to FIG. 1D, the photoresist pattern 12 is removed by a photoresist stripping process using $O_2$ plasma.

Referring to FIG. 1E, the hard mask 11 and the etch target layer 10 are etched using the spacer 13A as an etch mask, forming a hard mask pattern 11A and an etch target pattern 10A. A pitch P1 of the etch target pattern 10A can be smaller than the pitch limits of an exposure apparatus.

A thickness of the spacer 13A should be precisely controlled because the spacer 13A is used as an etch mask when etching underlying layers. Therefore, technology capable of precisely controlling a thickness at certain positions of the material layer 13 is required.

To meet the above requirement, it is desirable that the material layer 13 includes a polymer layer which is formed using a method suggested in U.S. Pat. No. 6,916,741 issued to Eric A. Hudson et al., entitled "Method for Plasma Etching Using Periodic Modulation of Gas Chemistry". In this method, a protective layer forming phase and an etching phase are periodically performed using periodic modulation of a deposition gas chemistry and an etching gas chemistry, so that a polymer layer can be formed to have a target thickness at a target position.

However, according to the above method, a large amount of carbon is included in the polymer layer because the polymer layer is usually formed using $C_xH_y$ (e.g., $C_2H_6$ or $CH_4$) gas or $C_xH_yF_z$ (e.g., $CH_3F$ or $CH_2F_2$) gas and so on. The polymer layer which includes a large amount of carbon (hereinafter, referred as a carbon-rich polymer layer) and the photoresist pattern 12 have a low etch selectivity to each other, so that the carbon-rich polymer layer is heavily lost while the photoresist pattern 12 is removed. Therefore, it is difficult to use the carbon-rich polymer layer as the etch mask when etching the underlying layers.

FIG. 2 illustrates a degree of loss of a carbon-rich polymer layer in a process of removing a photoresist pattern, that is, FIG. 2(A) illustrates the carbon-rich polymer layer which is formed over the whole surface of the resultant structure including the photoresist pattern; (B) illustrates the carbon-rich polymer layer which remains on both sidewalls of the photoresist pattern after a blanket etch process; and (C) illustrates a resultant structure after removing the photoresist pattern.

As can be seen from FIG. 2(C), a degree of loss of the carbon-rich polymer layer is higher than that of the photoresist pattern while removing the photoresist pattern. Therefore, it is difficult to use the carbon-rich polymer layer as the etch mask when etching the underlying layers.

SUMMARY OF THE INVENTION

Embodiments of the present invention relate to a method for forming a fine pattern in a semiconductor device using a polymer layer that includes Si—O bonds and is formed on both sidewalls of a photoresist pattern in a spacer patterning technology, thereby preventing a polymer layer from being lost in removing a photoresist pattern and easily etching underlying layers.

In accordance with an aspect of the present invention, there is provided a method for forming a fine pattern in a semiconductor device. The method includes forming an etch target layer; forming a photoresist pattern over the etch target layer; forming a polymer pattern including silicon-oxygen (Si—O) bonds on sidewalls of the photoresist pattern; removing the photoresist pattern; and etching the etch target layer using the polymer pattern as an etch mask.

DESCRIPTION OF SPECIFIC EMBODIMENTS

Embodiments of the present invention relate to a method for forming a fine pattern in a semiconductor device.

FIGS. 3A to 3E are cross-sectional views showing a method for forming a fine pattern in a semiconductor device in accordance with an embodiment of the present invention.

Figure 1A:
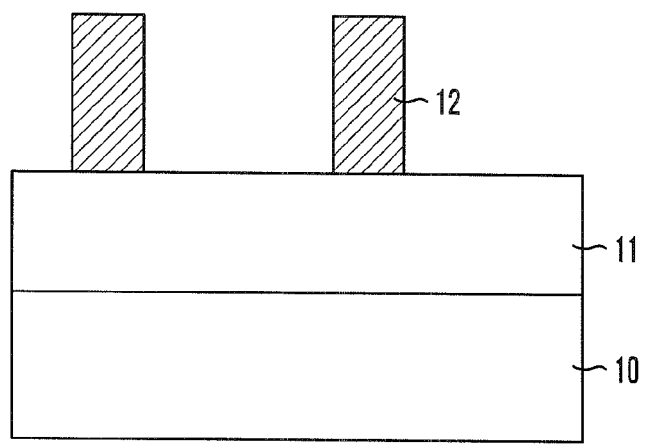
FIGS. 1A to 1E are cross-sectional views illustrating a typical method for performing spacer patterning technology.
Figure 1B:
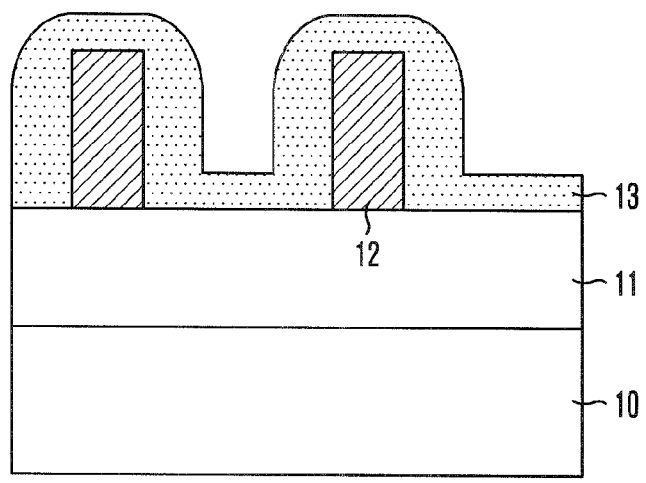
Figure 1C:
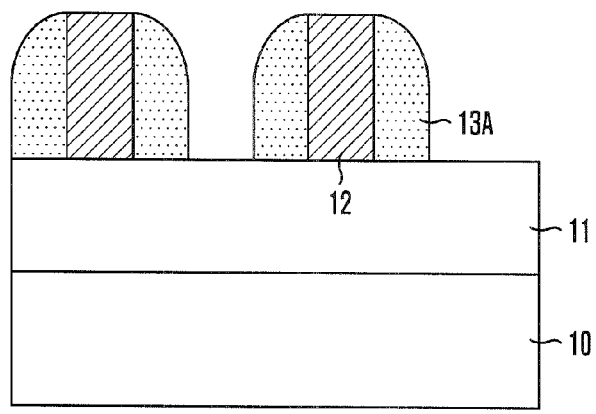
Figure 1D:
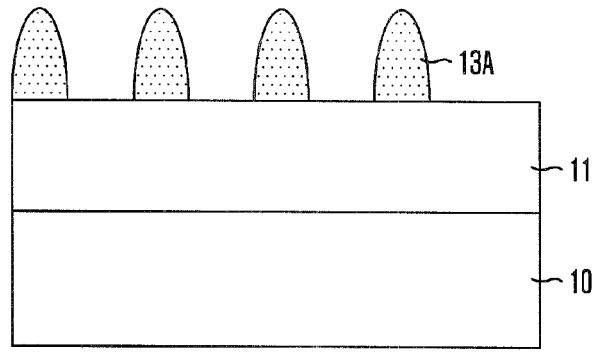
Figure 1E:
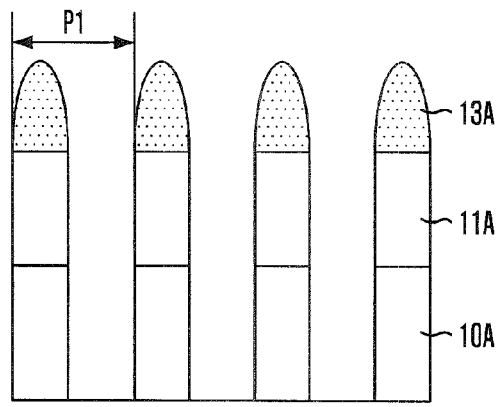
Figure 2:
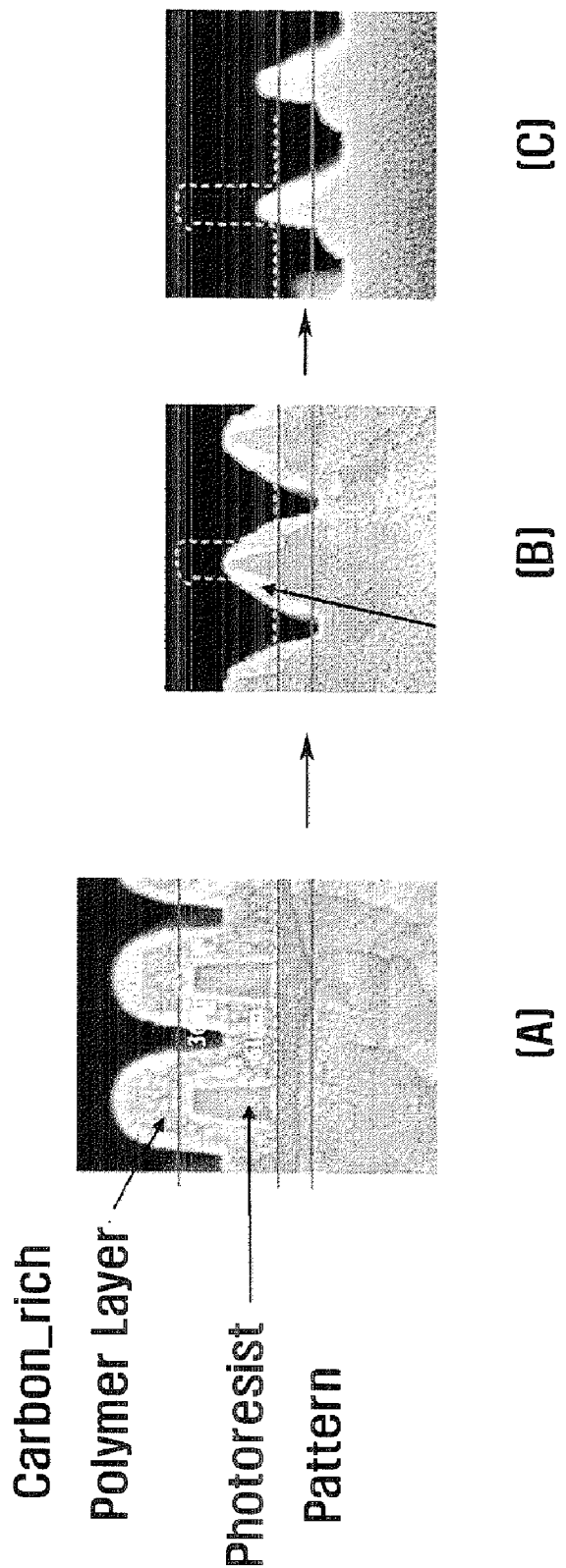
FIG. 2 illustrates a degree of loss of a carbon-rich polymer layer in a process of removing a photoresist pattern.
Figure 3A:
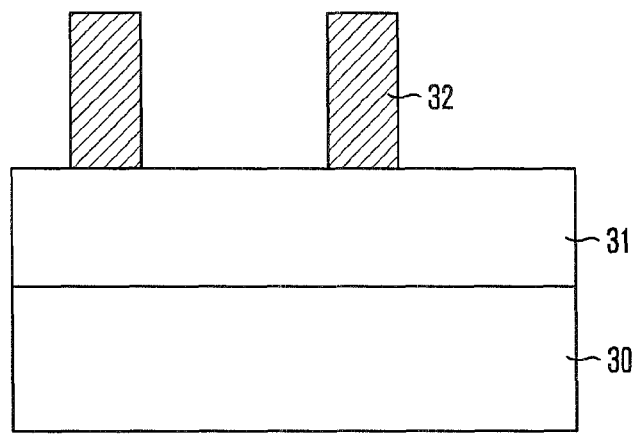
FIGS. 3A to 3E are cross-sectional views showing a method for forming a fine pattern in a semiconductor device in accordance with an embodiment of the present invention.

Referring to FIG. 3A, a hard mask 31 is formed over a etch target layer 30. The hard mask 31 may be formed of a single layer or a multilayer where a plurality of layers are stacked.

Next, a photoresist pattern 32 is formed over the hard mask 31.

Figure 3B:
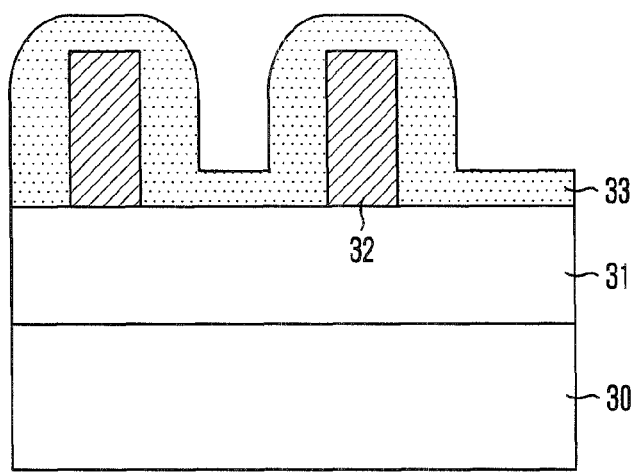

Referring to FIG. 3B, a polymer layer 33 including silicon-oxygen (Si—O) bonds is formed over the whole surface of the resultant structure including the photoresist pattern 32. The polymer layer 33 may be a $SiO_x$ polymer layer with Si—O bonds. In addition, the polymer layer 33 may be a polymer layer including Si—O bonds combined with one or more elements of carbon (C), hydrogen (H) and fluorine (F), for example, a $SiO_xF_y$ polymer layer, a $SiO_xH_y$ polymer layer, a $SiO_xC_y$ polymer layer or a $SiO_xC_yH_z$ polymer layer and the like. Herein, each variable, that is, x, y or z ranges from about 0.5 to about 2.

The process of forming the polymer layer 33 is performed using the above described method suggested in U.S. Pat. No. 6,916,741. Therefore, the polymer layer 33 can be formed to have a target thickness at a target position by periodic modulation of a deposition gas chemistry and an etching gas chemistry.

For example, as shown, the polymer layer 33 can be formed thicker on the sidewalls of the photoresist pattern 32 than over the hard mask 31 exposed by the photoresist pattern 32. However, there is no limitation on a shape of the polymer layer 33 described in FIG. 3B. In accordance with another embodiment, the polymer layer is formed on only sidewalls of the photoresist pattern 32, and then, a subsequent blanket etch may not be needed.

In addition, The process of forming the polymer layer 33 is performed using Si-containing gas, one or more gases selected from a group consisting of $C_xH_y$ (e.g., $C_2H_6$ or $CH_4$), $C_xH_yF_z$ (e.g., $CH_3F$ or $CH_2F_2$) and $C_xF_y$ (e.g., $C_4F_6$ or $CF_4$), and Ar gas. In this process, oxygen (O) in the photoresist pattern 32 including C—H—O bonds reacts with silicon (Si) in the Si-containing gas, so that the polymer layer 33 including Si—O bonds is formed.

Figure 3C:
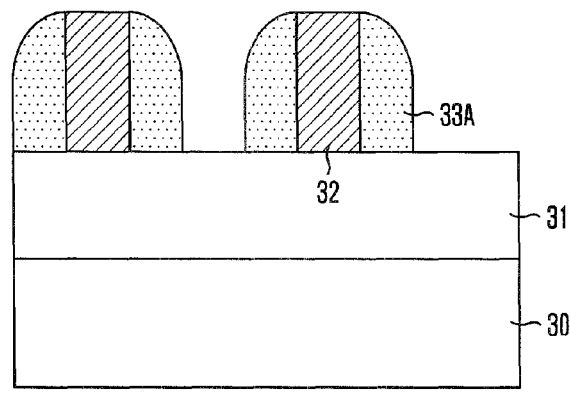

Referring to FIG. 3C, a blanket etch process is performed on the polymer layer 33. As a result, the polymer layer 33 remains on sidewalls of the photoresist pattern 32. Hereinafter, the polymer layer 33 which remains on sidewalls of the photoresist pattern 32 is referred to as a polymer pattern 33A.

Figure 3D:
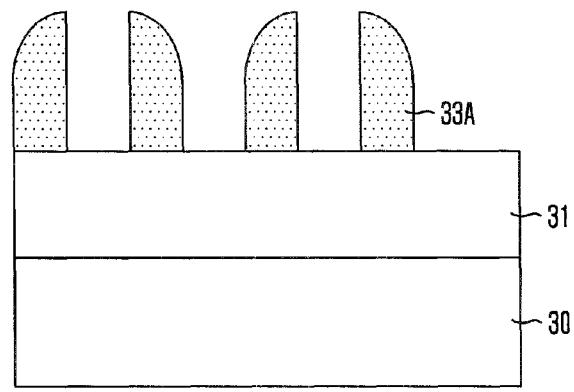

Referring to FIG. 3D, the photoresist pattern 32 is removed by a photoresist stripping process using $O_2$ plasma. At the same time, the polymer pattern 33A including Si—O bonds is cured by the $O_2$ plasma. Therefore, the polymer pattern 33A can be used as an etch mask in a subsequent process of etching underlying layers.

Figure 3E:
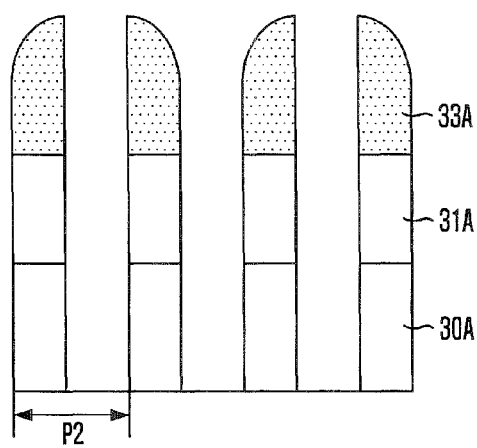

Referring to FIG. 3E, the hard mask 31 and the etch target layer 30 are etched using the polymer pattern 33A, consequently, a hard mask pattern 31A and an etch target pattern 30A are formed. A pitch P2 of the etch target pattern 30A can be smaller than the pitch limits of an exposure apparatus.

In accordance with the present invention, a polymer layer is used which includes Si—O bonds and is formed on both sidewalls of a photoresist pattern in spacer patterning technology. Thus, it is possible to prevent the polymer layer from being lost when removing the photoresist pattern and easily etch underlying layers, so that a fine pattern in a semiconductor device can be formed.

While the present invention has been described with respect to the specific embodiments, it will be apparent to those skilled in the art that various changes and modifications may be made without departing from the spirit and scope of the invention as defined in the following claims.

What is claimed is:

1. A method for forming a fine pattern in a semiconductor device, comprising:
   forming an etch target layer over a substrate;
   forming a photoresist pattern over the etch target layer;
   forming a polymer pattern on sidewalls of the photoresist pattern, wherein the polymer pattern is formed of one selected from the group consisting of an SiOx polymer pattern, an SiOxFy polymer pattern, and an SiOxHy polymer pattern;
   removing the photoresist pattern; and
   etching the etch target layer using the polymer pattern as an etch mask.

2. The method of claim 1, further comprising forming a hard mask over the etch target layer before forming the photoresist pattern.

3. The method of claim 1, wherein the forming of the polymer pattern comprises:
   forming a polymer layer formed of one selected from the group consisting of an SiOx polymer layer, a SiOxFy polymer layer, and an SiOxHy polymer layer over the whole surface of a resultant structure including the photoresist pattern conformally; and
   performing a blanket etch process on the polymer layer to form the polymer pattern on the sidewalls of the photoresist pattern.

4. The method of claim 3, wherein the polymer layer is formed by periodic modulation of a deposition gas chemistry and an etch gas chemistry.

5. The method of claim 1, wherein the polymer pattern is formed by periodic modulation of a deposition gas chemistry and an etch gas chemistry.

6. The method of claim 1, wherein the polymer pattern is formed using Si-containing gas, one or more gases selected from a group consisting of $C_xH_y$, $C_xH_yF_z$ and $C_xF_y$ gases, and Ar gas.

7. The method of claim 1, wherein the photoresist pattern is removed by using $O_2$ plasma.

8. The method of claim 7, wherein the polymer pattern is cured while the photoresist pattern is being removed.

9. The method of claim 1, wherein each of x and y ranges from about 0.5 to about 2.

10. A method for forming a fine pattern in a semiconductor device, comprising:
    forming an etch target layer over a substrate;
    forming a photoresist pattern over the etch target layer;
    forming a polymer pattern on sidewalls of the photoresist pattern using an Si-containing gas; one or more gases selected from the group consisting of CxHy, CxHyFz, and CxFy gases; and Ar gas;
    removing the photoresist pattern; and
    etching the etch target layer using the polymer pattern as an etch mask.

11. The method of claim 10, further comprising forming a hard mask over the etch target layer before forming the photoresist pattern.

12. The method of claim 10, wherein the forming of the polymer pattern comprises:
    forming a polymer layer using an Si-containing gas; one or more gases selected from the group consisting of CxHy, CxHyFz, and CxFy gases; and Ar gas over the whole surface of a resultant structure including the photoresist pattern conformally; and
    performing a blanket etch process on the polymer layer to form the polymer pattern on the sidewalls of the photoresist pattern.

13. The method of claim 12, wherein the polymer layer is formed by periodic modulation of a deposition gas chemistry and an etch gas chemistry.

14. The method of claim 10, wherein the polymer pattern is formed by periodic modulation of a deposition gas chemistry and an etch gas chemistry.

15. The method of claim 10, wherein the photoresist pattern is removed by using $O_2$ plasma.

16. The method of claim 15, wherein the polymer pattern is cured while the photoresist pattern is being removed.

* * * * *